United States Patent [19]

Chang

[11] Patent Number: 5,001,374

[45] Date of Patent: Mar. 19, 1991

[54] DIGITAL FILTER FOR REMOVING SHORT DURATION NOISE

[75] Inventor: Paul S. Chang, Harrisburg, Pa.

[73] Assignee: AMP Incorporated, Harrisburg, Pa.

[21] Appl. No.: 404,993

[22] Filed: Sep. 8, 1989

[51] Int. Cl.[5] .......................... H03K 5/00; H03B 1/04
[52] U.S. Cl. .................................. 307/542.1; 307/520; 307/543; 307/234; 328/111; 328/164
[58] Field of Search ...................... 307/542, 542.1, 543, 307/234, 520, 247.1; 328/111, 162, 164; 377/76

[56] References Cited

U.S. PATENT DOCUMENTS

| | | | |
|---|---|---|---|
| 3,624,518 | 11/1971 | Dildy, Jr. ........................... | 307/542.1 |
| 4,282,488 | 8/1981 | Norman et al. .................... | 307/247.1 |
| 4,403,193 | 9/1983 | Takemura ........................ | 307/542.1 |
| 4,427,948 | 1/1984 | Rinaldi ............................. | 307/542.1 |
| 4,525,635 | 6/1985 | Gillberg ............................. | 307/234 |
| 4,585,997 | 4/1986 | Lin ..................................... | 307/542 |
| 4,775,840 | 10/1988 | Ohmori et al. ..................... | 307/234 |
| 4,786,823 | 11/1988 | Abe et al. .......................... | 307/234 |

FOREIGN PATENT DOCUMENTS 2424816 12/1975 Fed. Rep. of Germany ... 307/542.1

Primary Examiner—Timothy P. Callahan

[57] ABSTRACT

A digital filter for removing short duration perturbations from a regular train of bilevel pulses on an input line (10) includes a clock (12) for providing a clock signal at a frequency which is an integral multiple of the pulse train frequency. This defines a plurality of subintervals within the interval defined by each of the pulses. The clock signal and the pulse train are applied to a shift register (16, 18) which is coupled to circuitry (24, 28) which examines the level of the signal on the input line (10) during two consecutive subintervals. This circuitry (24, 28) is coupled to output circuitry (32) for providing a clock-synchronized filtered pulse train on an output line (34) which has a data bit length equal to that of the signal on the input line (10) but is delayed by two of the subintervals defined by the clock (12).

2 Claims, 2 Drawing Sheets

DIGITAL FILTER FOR REMOVING SHORT DURATION NOISE

BACKGROUND OF THE INVENTION

This invention relates to a digital filter for removing short duration perturbations from a regular train of bilevel pulses.

Data signals applied to the input of digital circuitry typically take the form of a regular train of bilevel pulses. The digital circuitry is typically formed on an integrated circuit chip and the data signals typically originate from a source which is not on that chip. Accordingly, the data signals must travel over some transmission medium before they are presented as inputs to the digital circuitry. While on that transmission medium, they are subject to external interference which causes short duration perturbations (i.e., spikes and glitches). These perturbations are undesirable because they cause false readings of the data and result in processing errors.

Accordingly, it is a primary object of this invention to provide a method and means for eliminating these perturbations.

SUMMARY OF THE INVENTION

The foregoing and additional objects are attained in accordance with the principles of this invention by providing an arrangement which is preferably located at the receiving end of digital circuitry on an integrated circuit chip. This arrangement is a digital filter for removing short duration perturbations from a regular train of bilevel pulses on an input line to the chip and providing a clock-synchronized filtered pulse train on an output line to the chip's digital circuitry. The digital filter includes a clock which provides a clock signal at a frequency which is an integral multiple of the frequency of the pulse train so as to define a plurality of subintervals within the interval defined by each of the pulses. Examination means utilizes the clock signal for examining the level of the signal on the input line during two consecutive subintervals and provides a first examination signal when the levels of the signal on the input line during the two consecutive subintervals are the same and are at a first level, a second examination signal when the levels of the signal on the input line during the two consecutive subintervals are the same and are at a second level, and a third examination signal when the levels of the signal on the input line during the two consecutive subintervals are different. An output means coupled to the examination means provides an output signal on the output line beginning during the subinterval immediately following the two consecutive subintervals. The output signal is at the first level in response to the first examination signal and at the second level in response to the second examination signal, the output means responding to the third examination signal by providing the output signal without change at the same level at which it had been.

In accordance with an aspect of this invention, the foregoing objects are attained by a method which comprises the steps of providing a clock signal at a frequency which is an integral multiple of the frequency of the pulse train so as to define a plurality of sub-intervals within the interval defined by each of the pulses, examining the level of the signal on the input line during two consecutive subintervals, and if the level of the input signal during the two consecutive subintervals is the same, providing an output signal at that level during the following subinterval, otherwise providing an output signal without changing the level at which it had been.

BRIEF DESCRIPTION OF THE DRAWINGS

The foregoing will be more readily apparent upon reading the following description in conjunction with the drawings wherein.

DETAILED DESCRIPTION

Figure 1A:
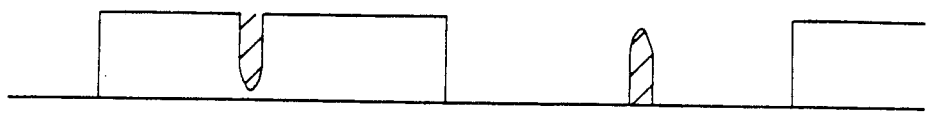
FIGS. 1A, 1B and 1C are timing charts illustrating the problem addressed by this invention.
Figure 1B:
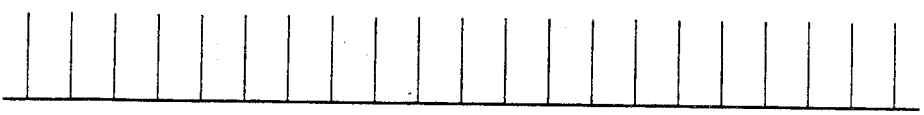

FIG. 1A shows an illustrative data signal formed as a regular train of bilevel pulses which may be applied as an input to digital circuitry. Typically, such a pulse train is clock-synchronized for processing by the digital circuitry. This is conventionally accomplished by providing a clock signal at a frequency which is an integral multiple of the frequency of the pulse train. Thus, for example, if the pulse train is at a one megahertz rate, then the clock signal can be at an eight megahertz rate, thereby dividing each of the pulses into eight subintervals. Such a clock signal is shown in FIG. 1B A common way of synchronizing the pulse train shown in FIG. 1A with the clock signal shown in FIG. 1B is to utilize a D-type flip flop, with the pulse train being applied to the D input of the flip flop and the clock signal being applied to the clock input of the flip flop. The synchronized pulse train may then be taken from the Q output of the flip flop. However, as discussed above, there is often interference on the input line which results in short duration perturbations being superimposed on the data signal. FIG. 1A shows illustrative perturbations (glitches or spikes) as shaded pulses within a ONE bit and a ZERO bit of the pulse train. When this occurs, the clock-synchronized pulse train will appear as shown in FIG. 1C, with the clocked perturbations being shown as shaded pulses.

Figure 1C:
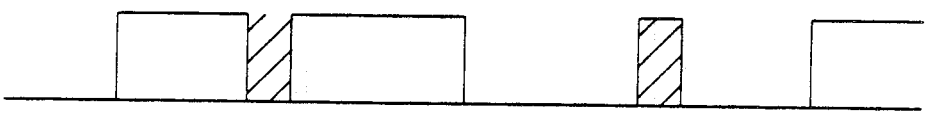
Figure 2:
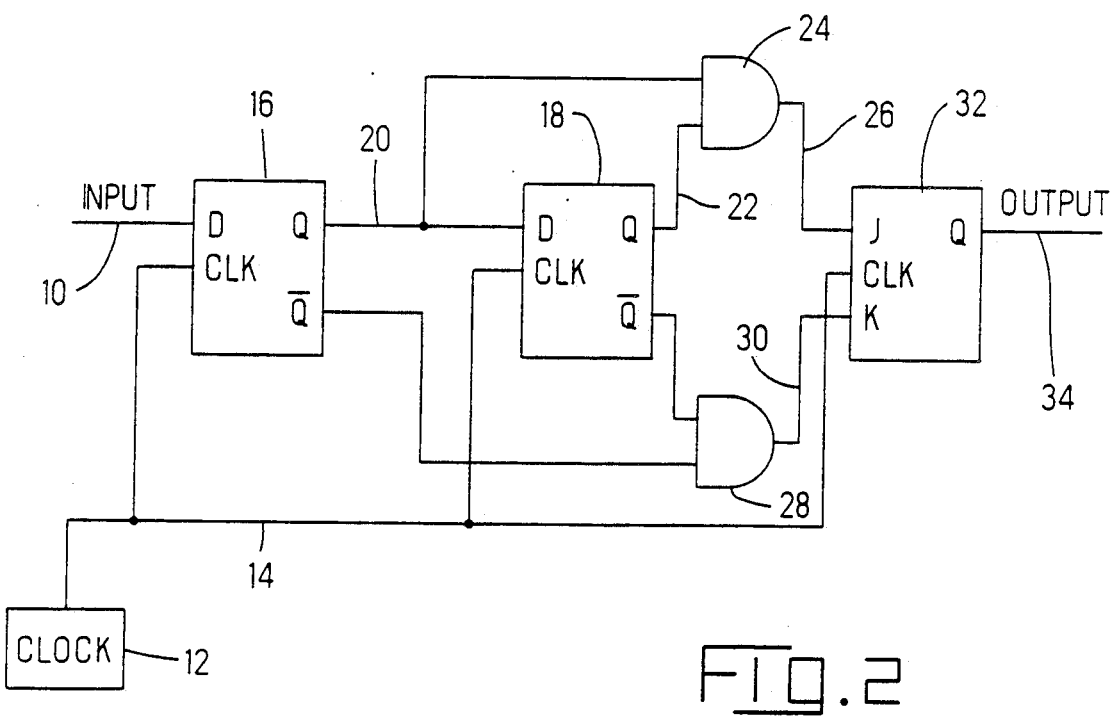
FIG. 2 is a logic circuit diagram showing an illustrative embodiment of a circuit arrangement constructed in accordance with the principles of this invention.

FIG. 2 depicts illustrative circuitry which acts as a digital filter to eliminate the clocked perturbations of FIG. 1C. This circuitry operates by providing a clock signal at a frequency which is an integral multiple of the frequency of the pulse train so as to define a plurality of subintervals within the interval defined by each of the pulses in the regular train bilevel pulses, examining the level of the signal on the input line during two consecutive subintervals, and if the level of the input signal during the two consecutive subintervals is the same, providing an output signal at that level during the following subinterval, otherwise providing an output signal without changing the level at which it had been. The operation of the circuitry shown in FIG. 2 is as follows, with waveforms appearing on different lines in the circuitry being shown in FIGS. 3A-3G.

Figure 3A:
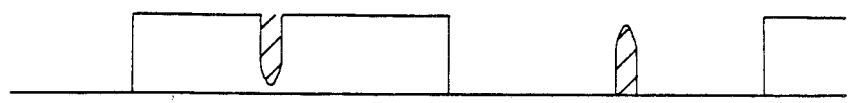
FIGS. 3A, 3B, 3C, 3D, 3E, 3F, and 3G are timing charts showing the operation of the circuit of FIG. 2.
Figure 3B:
Figure 3C:
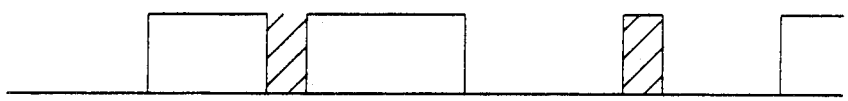
Figure 3D:
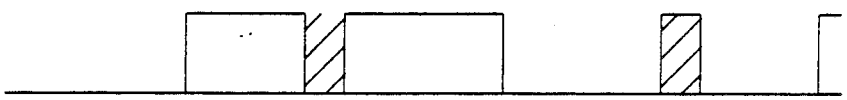

Referring now to FIG. 2 and FIGS. 3A-3G, an illustrative regular train of bilevel pulses having short duration perturbations thereon, as shown in FIG. 3A, is applied as an input on the lead 10. A clock 12 is provided, having as its output on the lead 14 a clock signal at a frequency which is an integral multiple of the frequency of the pulse train on the input lead 10. Illustratively, as shown in FIG. 3B, this clock signal is a series of short duration pulses at eight times the frequency of the input pulse train. These clock pulses define eight subintervals within the interval defined by each of the input pulses. The circuit shown in FIG. 2 includes a pair of D-type flip flops 16 and 18 arranged as a two stage shift register. The clock lead 14 is coupled to the clock inputs of the flip flops 16 and 18 and the input lead 10 is coupled to the D input of the first flip flop 16. The Q output of the flip flop 16 is connected to the D input of the second flip flop 18. Accordingly, as is known in the art, when a clock pulse appears on the lead 14 whatever signal is present at the D input of each of the flip flops 16 and 18 results in that signal being transferred to the Q output of that flip flop. Thus, when a string of D-type flip flops are connected as shown in FIG. 2, a series of clock pulses will cause an input signal to be shifted down the string of flip flops. FIG. 3C illustrates the signal appearing at the Q output 20 of the flip flop 16 and FIG. 3D illustrates the signal appearing at the Q output 22 of the flip flop 18. The $\overline{Q}$ outputs of the flip flops 16 and 18 are complemental to their Q outputs.

Figure 3E:
Figure 3F:

The Q outputs of the flip flops 16 and 18 are connected to the inputs of a first AND gate 24 whose output on the lead 26 is shown in FIG. 3E. Similarly, the $\overline{Q}$ outputs of the flip flops 16 and 18 are connected to the inputs of a second AND gate 28 whose output on the lead 30 is shown in FIG. 3F.

Thus, the flip flops 16 and 18 and the AND gates 24 and 28 together function to examine the level of the signal on the input line 10 and provide signals on the leads 26 and 30 which are a function of that examination. Thus, if the signal on the input line 10 is the same and at the ONE level during two consecutive subintervals, then the signal on the lead 26 is a ONE and the signal on the lead 30 is a ZERO. If the signal on the input line 10 is the same and at the ZERO level during two consecutive subintervals, then the signal on the lead 26 is a ZERO and the signal on the lead 30 is a ONE. On the other hand, if the signal on the input line 10 during two consecutive subintervals is different, the signals on the leads 26 and 30 are both ZERO.

Figure 3G:

The outputs of the AND gates 24 and 28 are coupled to the J and K inputs, respectively, of the JK-type flip flop 32. The clock lead 14 is connected to the clock input of the flip flop 32. As is known in the art, a JK-type flip flop, in response to clock pulses at its clock input and input signals at its J and K inputs, provides at its Q output a signal at a logic level ZERO if the J input is ZERO and the K input is ONE and provides at its Q output a signal at a logic level ONE if its J input is ONE and its K input is ZERO. If both the J and K inputs are ZERO, the signal at the Q output does not change. If both the J and K inputs are ONE, the signal at the Q output changes, either from ZERO to ONE or from ONE to ZERO. The signal at the Q output of the flip flop 32 on the output lead 34 is shown in FIG. 3G. It is noted that the original perturbations have been removed, with the output signal having a data bit length which is equal to that of the input signal but is delayed by two subintervals defined by the clock 12.

Accordingly, there has been described a digital filter for removing short duration perturbations from a regular train of bilevel pulses. While a preferred embodiment has been disclosed, it will be apparent to one of ordinary skill in the art that various modifications and adaptations to the disclosed arrangement can be made without departing from the spirit and scope of this invention, which is only intended to be limited by the appended claims.

I claim:

1. A digital filter for removing short duration perturbations from a regular train of bilevel pulses on an input line (10) and providing a clock-synchronized filtered pulse train on an output line (34), said digital filter comprising:

clock means (12) for providing a clock signal at a frequency which is an integral multiple of the frequency of the pulse train so as to define a plurality of subintervals within the interval defined by each of the pulses;

examination means (16, 18, 24, 28) utilizing said clock signal for examining the level of the signal on said input line (10) during two consecutive subintervals and providing a first examination signal when the levels of the signal on said input line during the two consecutive subintervals are the same and are at a first level, a second examination signal when the levels of the signal on said input line during the two consecutive subintervals are the same and are at a second level, and a third examination signal when the levels of the signal on said input line during the two consecutive subintervals are different; and output means (32) coupled to said examination means for providing an output signal on said output line (34) beginning during the subinterval immediately following the two consecutive subintervals, said output signal being at the first level in response to said first examination signal and at the second level in response to said second examination signal, said output means (32) responding to said third examination signal by providing said output signal without change at the same level at which it had been;

said examination means comprising:
   a first D-type flip flop (16) having its D-input coupled to said input line and its clock input coupled to receive said clock signal (14);
   a second D-type flip flop (18) having its D-input coupled to the Q output of said first D-type flip flop (16) and its clock input coupled to receive said clock signal (14);
   a first AND gate (24) having two inputs, each of which is coupled to a respective one of the Q outputs of said first (16) and second (18) D-type flip flops;
   a second AND gate (28) having two inputs, each of which is coupled to a respective one of the $\overline{Q}$ outputs of said first (16) and second (18) D-type flip flops;

said output means including a JK-type flip flop (32) having its clock input coupled to receive said clock signal (14), its J input coupled to the output of one of said AND gates (24, 28) its K input coupled to the output of the other of said AND gates (28, 24), and its Q output coupled to said output line (34).

2. A digital filter for removing short duration perturbations from a regular train of bilevel pulses on an input line (10) and providing a clock-synchronized filtered pulse train on an output line (34), said digital filter comprising:

clock means (12) for providing a clock signal at a frequency which is an integral multiple of the frequency of the pulse train so as to define a plurality of subintervals within the interval defined by each of the pulses;

examination means (16, 18, 24, 28) utilizing said clock signal for examining the level of the signal on said input line (10) during two consecutive subintervals and providing a first examination signal when the levels of the signal on said input line during the two consecutive subintervals are the same and are at a first level, a second examination signal when the levels of the signal on said input line during the two consecutive subintervals are the same and are at a second level, and a third examination signal when the levels of the signal on said input line during the two consecutive subintervals are different; and output means (32) coupled to said examination means for providing an output signal on said output line (34) beginning during the subinterval immediately following the two consecutive subintervals, said output signal being at the first level in response to said first examination signal and at the second level in response to said second examination signal, said output means (32) responding to said third examination signal by providing said output signal without change at the same level at which it had been;

said examination means comprising:

shift register means (16, 18) coupled to said input line (10) and said clock (12) for providing a plurality of time displaced signals representative of the signal on said input line during consecutive subintervals, said shift register means (16, 18) including a first D-type flip flop (16) having its D-input coupled to said input line (10) and its clock input coupled to receive said clock signal (14) and a second D-type flip flop (18) having its D-input coupled to the Q output of said first D-type flip flop (16) and its clock input coupled to receive said clock signal (14); and gate means (24, 28) coupled to adjacent stages of said shift register means (16, 18) for providing said examination signals, said gate means (24, 28) including a first AND gate (24) having two inputs, each of which is coupled to a respective one of the Q outputs of said first (16) and second (18) D-type flip flops and a second AND gate (28) having two inputs, each of which is coupled to a respective one of the Q outputs of said first (16) and second (28) D-type flip flops;

said output means (32) including a JK-type flip flop (32) having its clock input coupled to receive said clock signal (14), its J input coupled to the output of one of said AND gates (24, 28), its K input coupled to the output of the other of said AND gates (28, 24), and its Q output coupled to said output line (34).

* * * * *

UNITED STATES PATENT OFFICE
CERTIFICATE OF CORRECTION

Patent No. 5,001,374    Dated   March 19, 1991

Inventor(s)   Paul S. Chang

It is certified that error appears in the above-identified patent and that said Letters Patent is hereby corrected as shown below:

In claim 1, column 4, line 52, the letter "Q" should be --$\bar{Q}$--.

In claim 2, column 6, line 3, the words "time displaced" should be --time-displaced--.

In claim 2, column 6, line 21, the letter "Q" should be --$\bar{Q}$--.

Signed and Sealed this

Eighth Day of September, 1992

Attest:

DOUGLAS B. COMER

Attesting Officer    Acting Commissioner of Patents and Trademarks